(12) United States Patent
Pirovano et al.

(10) Patent No.: US 10,777,275 B2
(45) Date of Patent: Sep. 15, 2020

(54) RESET REFRESH TECHNIQUES FOR SELF-SELECTING MEMORY

(71) Applicant: Intel Corporation, Santa Clara, CA (US)

(72) Inventors: Agostino Pirovano, Agrate Brianza (IT); Hernan A. Castro, Shingle Springs, CA (US); Innocenzo Tortorelli, Cernusco sul Naviglio (IT); Andrea Redaelli, Casatenovo (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/143,033

(22) Filed: Sep. 26, 2018

(65) Prior Publication Data

US 2019/0043580 A1 Feb. 7, 2019

(51) Int. Cl.
*G11C 11/00* (2006.01)
*G11C 13/00* (2006.01)
(Continued)

(52) U.S. Cl.
CPC ...... *G11C 13/0097* (2013.01); *G11C 13/0004* (2013.01); *G11C 13/0033* (2013.01); *G11C 13/0069* (2013.01); *H01L 27/2463* (2013.01); *H01L 45/06* (2013.01); *G11C 13/003* (2013.01); *G11C 2013/009* (2013.01); *G11C 2013/0073* (2013.01); *G11C 2013/0078* (2013.01);
(Continued)

(58) Field of Classification Search
CPC ............ G11C 13/0097; G11C 13/0004; G11C 13/0033; G11C 13/0069; G11C 11/5678; H01L 27/2463; H01L 45/06
See application file for complete search history.

(56) References Cited

U.S. PATENT DOCUMENTS 9,312,005 B2   4/2016 Castro
9,324,423 B2   4/2016 Castro
(Continued)

FOREIGN PATENT DOCUMENTS

KR     20100117121 A    11/2010

OTHER PUBLICATIONS

Ielmini et al, "Recovery and Drift Dynamics of Resistance and Threshold Voltages in Phase-Change Memories", IEEE Transactions on Electron Devices, vol. 54, No. 2, Feb. 2007, 8 pages.
(Continued)

*Primary Examiner* — Uyen Smet
(74) *Attorney, Agent, or Firm* — Compass IP Law, PC

(57) ABSTRACT

Reset refresh techniques are described, which can enable reducing or canceling the drift of threshold voltage distributions exhibited by memory cells. In one example a memory device includes an array of memory cells. The memory cells include a chalcogenide storage material. The memory device includes hardware logic to program the memory cells, including logic to detect whether a memory cell is selectable with a first voltage having a first polarity. In response to detection that a memory cell is not selectable with the first voltage, the memory cell is refreshed the memory cell with a second voltage that has a polarity opposite to the first voltage. After the refresh with the second voltage, the memory cell can be programmed with the first voltage having the first polarity.

20 Claims, 8 Drawing Sheets

(51) Int. Cl.
*H01L 27/24* (2006.01)
*H01L 45/00* (2006.01)

(52) U.S. Cl.
CPC ...... *G11C 2213/73* (2013.01); *G11C 2213/77* (2013.01); *H01L 45/141* (2013.01)

(56) References Cited

U.S. PATENT DOCUMENTS

| | | |
|---|---|---|
| 10,147,875 B1 * | 12/2018 | Hansen .................. H01L 45/12 |
| 2005/0226034 A1 | 10/2005 | Pemer |
| 2011/0019495 A1 | 1/2011 | Scheuerlein et al. |
| 2015/0294716 A1 | 10/2015 | Tortorelli et al. |
| 2015/0325289 A1 | 11/2015 | Castro |
| 2016/0276026 A1 * | 9/2016 | Hase .................. G11C 13/0069 |
| 2017/0125097 A1 | 5/2017 | Tortorelli et al. |
| 2017/0236580 A1 | 8/2017 | Chu et al. |
| 2018/0211703 A1 * | 7/2018 | Choi .................. G11C 13/0038 |
| 2020/0066343 A1 | 2/2020 | Castro et al. |

OTHER PUBLICATIONS

Kostylev, "Recovery and other effects of annihilation of high current density filaments after switching in chalcogenide alloys", 2008 9th Annual Non-Volatile Memory Technology Symposium (NVMTS), Nov. 11-14, 2008, 7 pages.

\* cited by examiner

RESET REFRESH TECHNIQUES FOR SELF-SELECTING MEMORY

FIELD

The descriptions are generally related to techniques for accessing memory cells, and more particularly, descriptions are related to reset refresh techniques for memory devices such as chalcogenide-based memory, such as a chalcogenide-based self-selecting memory.

BACKGROUND

Memory resources have innumerable applications in electronic devices and other computing environments. Continued drive to smaller devices has resulted in scaling issues with traditional memory devices. Thus, there is a current demand for memory devices that can scale smaller than traditional memory devices. Energy efficiency is also a driving factor in the exploration and design of new memory technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

DETAILED DESCRIPTION

Described herein are memory access techniques involving a "reset refresh" that can enable recovering memory cells that have experienced drift of threshold voltage distributions. Some memory technologies, such as chalcogenide-based memories, may experience drift of threshold voltage distributions to higher voltages, which can make it difficult or infeasible to select and program the memory cell. In some such memories, the threshold voltage distributions may vary depending on both the polarity of the voltage used to previously program the cell and the polarity of the voltage that is going to be used to program the cell. Some scenarios (such as a reset operation followed by a set operation) can have a significantly higher threshold voltage distribution than other scenarios (e.g., a refresh operation, consisting of a set-on-set or reset-on-reset operation). Drift can be particularly an issue for scenarios in which memory cells exhibit a high pre-drift threshold voltage, and can even result in a memory cell being unrecoverable.

In one example, if a memory cell has experienced drift that has rendered the memory cell un-selectable with a given program voltage, the memory cell can be refreshed to the same value that was already stored in the memory cell (using a voltage pulse with the opposite polarity of the desired program voltage), followed by another voltage pulse with the same polarity as the desired program voltage. By refreshing the memory cell with a voltage pulse having the opposite polarity relative to the desired program pulse, the drift of the threshold voltage can be reduced or canceled, enabling the memory cell to be programmed even after significant drift. In one such example, this technique is used to program memory cells in a reset state to a set state. Thus, the term "reset refresh" refers to refreshing a memory cell that was already in a reset state, which can enable canceling the voltage drift for that memory cell. In one such example in which the reset state corresponds to a logic-0, a reset refresh refers to programming a memory cell previously programmed to a logic-0 with logic-0. Note that although the term reset refresh is used throughout for convenience, other conventions may be used. For example, the techniques described herein are not limited to refreshing memory cells programmed to a logic-0, but may involve refreshing a memory cell programmed to a logic-1.

Figure 1:
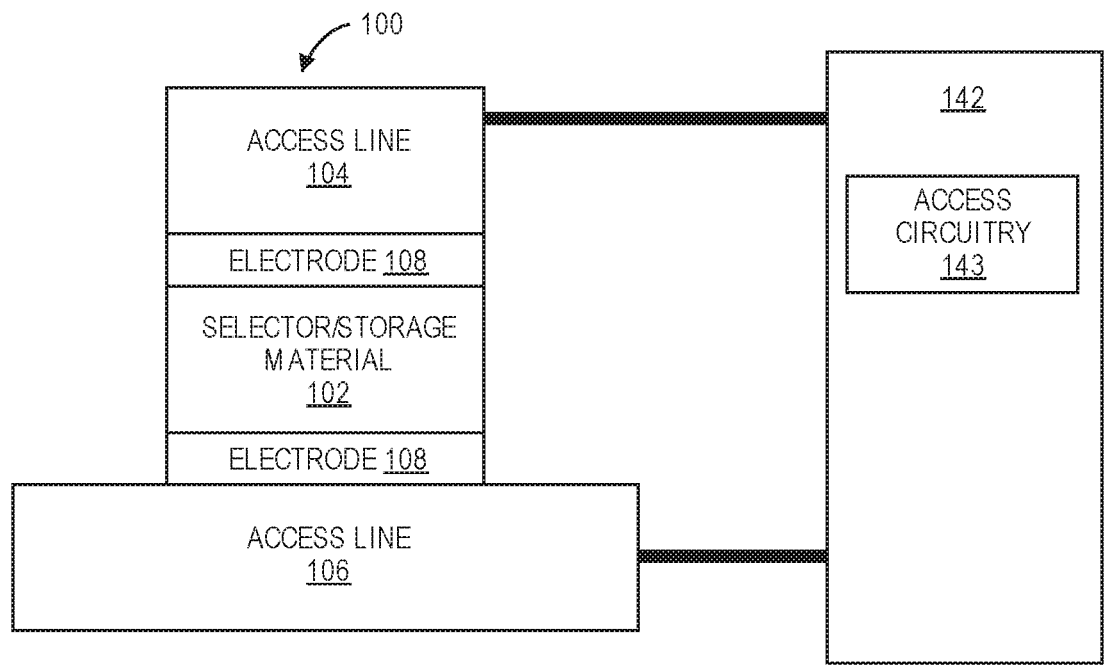
FIG. 1 is an example of a memory cell that can be accessed using reset refresh techniques described herein.

FIG. 1 illustrates one example of a memory cell that can be programmed using a reset refresh technique.

FIG. 1 illustrates a memory cell 100. The memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to the access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state.

In one example, the storage material is capable of switching between two or more stable states without changing phase. In one such embodiment, the access circuitry 143 programs the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event and application of current for a duration of time, which causes the memory cell 100 to exhibit a particular threshold voltage at a subsequent reading voltage of a same or different polarity. In one such embodiment, the storage material 102 is a self-selecting material that can be programmed by inducing a threshold event.

As mentioned above, the output of such a memory cell when read differs as a function of the polarity used to program the memory cell and the polarity used to read the memory cell. For example, in one embodiment, the storage material 102 exhibits a "lower threshold voltage" or a "higher threshold voltage" in response to a read voltage pulse based on the polarity of both the programming and read voltages. In one embodiment, exhibiting a threshold voltage means that there is a threshold voltage associated with the memory cell that is approximately equal to the threshold voltage in response to the application of a voltage with a particular magnitude and polarity to the terminals of the memory cell.

As mentioned above, the access lines 104, 106 electrically couple the memory cell 100 with circuitry 142. The access lines 104, 106 can be referred to as a bitline and wordline, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the control circuitry 142, the access lines 104, 106 communicatively couple the circuitry 142 to the memory cell 100, in accordance with an embodiment. The control circuitry 142 includes access circuitry 143. Circuitry includes electronic components that are electrically coupled to perform analog or logic operations on received or stored information, output information, and/or store information. In one embodiment, the access circuitry 143 applies voltage pulses to the access lines 104, 106 to write to or read the memory cell 100. The terms "write" and "program" are used interchangeably to describe the act of storing information in a memory cell. In one embodiment, to write to the memory cell 100, the access circuitry applies a voltage pulse with a particular magnitude and polarity to the access lines 104, 106, which can both select memory cell 100 and program memory cell 100.

In one embodiment, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, in one example, the access circuitry 143 applies a voltage pulse with a particular magnitude and polarity to the access lines 104, 106, which results in an electrical response that can be detected or sensed. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on the electrical response of the memory cell to the voltage pulse.

The memory cell 100 is one example of a memory cell that can be accessing using reset refresh techniques. Other embodiments can include memory cells having additional or different layers of material than illustrated in FIG. 1 (e.g., a thin dielectric material between the storage material and access lines).

Figure 2:
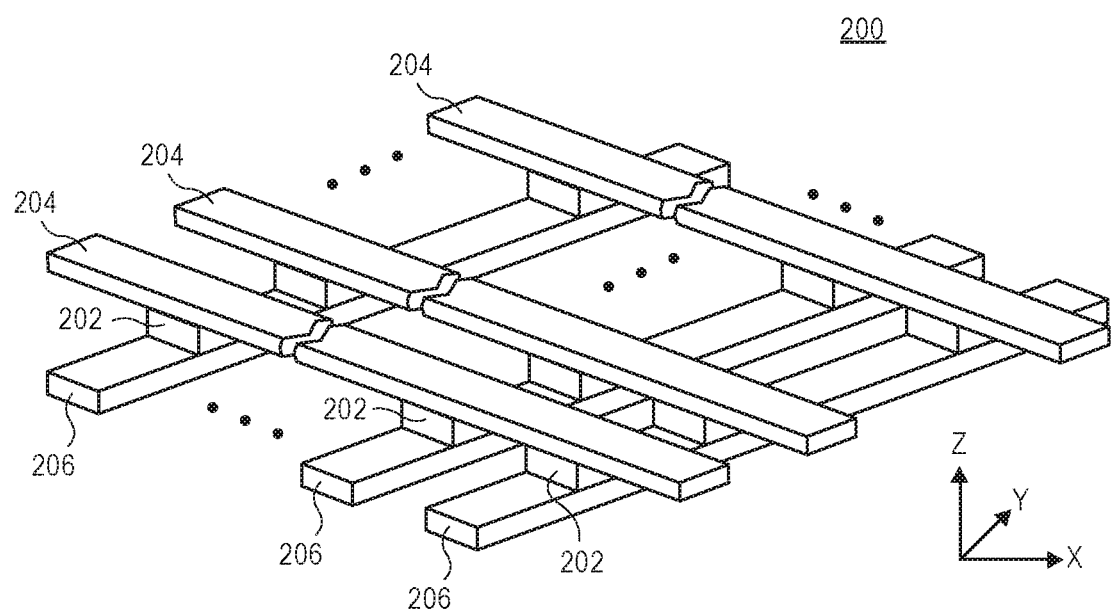
FIG. 2 illustrates an example of a portion of a memory cell array.

FIG. 2 illustrates a portion of a memory cell array 200, which can include a memory cell such as the memory cell 100 of FIG. 1, in accordance with one example. Memory cell array 200 is an example of a three dimensional (3D) cross-point memory structure. The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. In one embodiment, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one embodiment, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction). FIGS. 1 and 2 illustrate an example of a memory cell and array in which double-polarity reads can be implemented. However, reset refresh techniques can be implemented in other memory cell structures and arrays in which the memory cells exhibit electrical responses that vary as a function of programming polarity.

Figure 3:
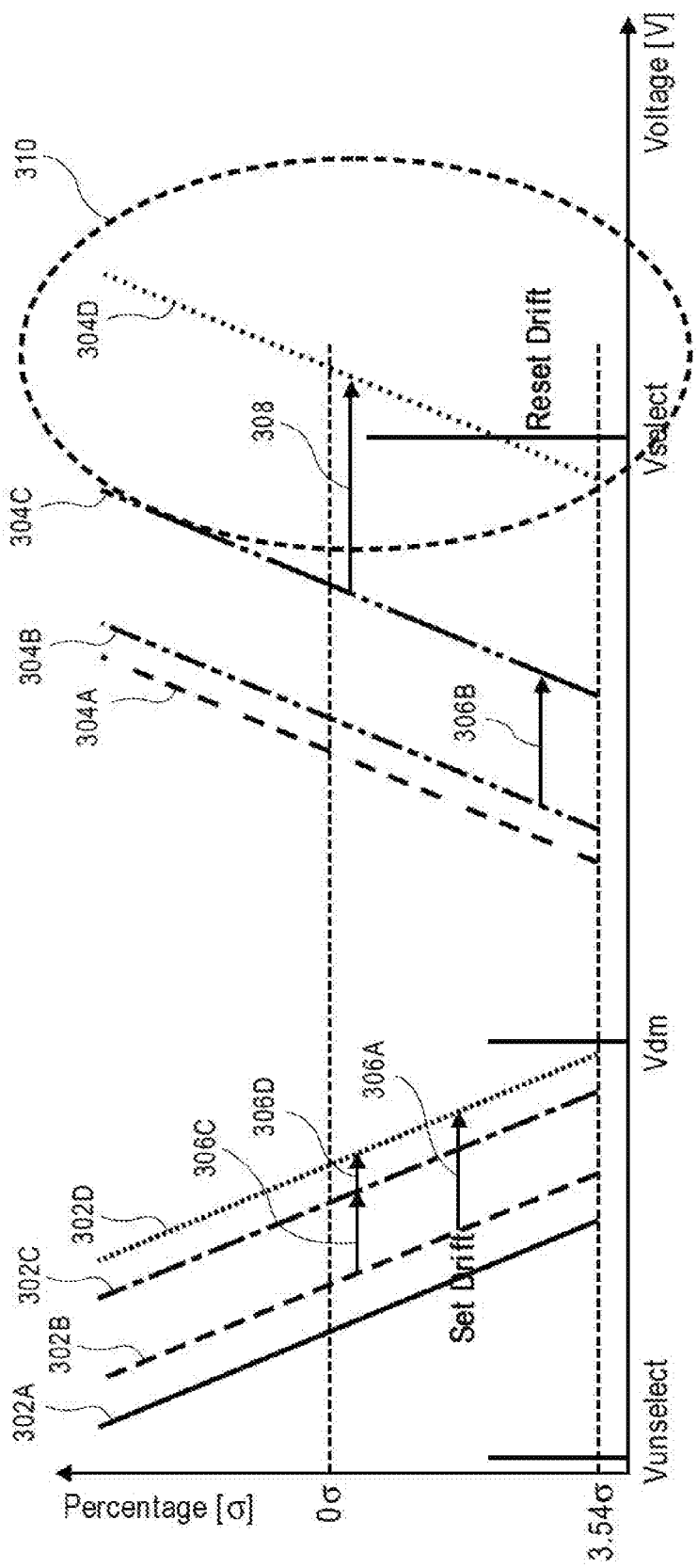
FIG. 3 is a graph of distributions of threshold voltages exhibited by memory cells under varying conditions.

FIG. 3 is a graph of distributions of threshold voltages exhibited by memory cells under varying conditions. The x-axis of the graph is voltage (V) and the y-axis shows percentage. Thus approximately 50% of memory cells exhibit threshold voltages indicated above the 0σ line, and approximately 50% of the memory cells exhibit threshold voltages as indicated below the 0σ line. The different lines indicate threshold voltage distributions under different conditions in response to a positive programming pulse (e.g., to program the memory cell to a logic 1). For ease of reference, the following description refers to a positive programming pulse as writing a "logic 1" to a memory cell and a negative programming pulse as writing a "logic 0" to a memory cell, although a different convention can be adopted. For example, in one embodiment, access circuitry can apply a negative programming pulse to write a logic 1 and a positive programming pulse to write a logic 0.

Referring again to FIG. 3, Vselect is the selection or programming voltage. In one example, access circuitry applies a fraction (e.g., half) of Vselect to the bitline and the remaining fraction to the wordline to generate the desired voltage across the memory cell. In the illustrated example, in order to program a memory cell, Vselect should be higher than the threshold voltage distributions to cause the memory cell to threshold. Vunselect is a voltage that is applied to the unselected wordlines and bitlines. Vdm is a voltage with a magnitude between the expected threshold distributions of set and reset cells. In one example, a read operation involves applying a voltage pulse having the magnitude of Vdm and determining whether the cell thresholds in response to the voltage pulse. The distributions 302A, 302B, 302C, and 302D represent threshold voltage distributions exhibited by memory cells when performing a set operation on memory cells that were previously programmed to a logic 1. The distributions 304A, 304B, 304C, and 304D represent threshold voltage distributions exhibited by memory cells when performing a set operation when previously programmed to a logic 0. As can be seen in the graph, the memory cells exhibit threshold voltage distributions with lower magnitudes when subsequently programmed with the same polarity as the prior programming operation (e.g., a set-on-set operation). Memory cells exhibit threshold voltage distributions with higher magnitudes when subsequently programmed with the opposite polarity relative to the prior programming operation (e.g., a set-on-reset operation).

The threshold voltage distributions shift or drift in response to various conditions, such as the passing of time, memory accesses, or both. The drift may further depend on the polarities used to program the cells, as mentioned above, and also on the temperature of the memory cell during programming and/or reading. The distributions 302B and 304B illustrate threshold voltage distributions when the memory cells are "fresh," meaning the memory cells were recently fabricated and shortly after programming. Shortly after programming but after additional memory accesses (e.g., on the order of a hundred thousand cycles), the memory cells may exhibit a shift in one direction due to effects from the programming cycles. For example, the distribution 302A illustrates a threshold voltage distribution for a set operation shortly after program and after 100$k$ cycles when being programmed to a logic 1. Note that the threshold voltage distribution 302A is lower in magnitude than the distribution 302B of the fresh memory cells. Similarly, the distribution 304A illustrates the threshold voltage distribution of memory cells shortly after programming and after 100$k$ cycles for a logic 0.

After more time, more cycles, or both, the memory cells in the illustrated examples exhibit threshold voltages which have drifted to higher magnitudes. For example, the distribution 302C represents the "fresh" threshold voltage distribution of memory cells after two days. The distribution 302D represents the threshold voltage distribution of the memory cells after two days and after more programming operations (e.g., on the order of one or more megacycles). Thus, after more time and cycles the memory cells experience drift 306A. In the illustrated example, the set drift is approximately 500 mV or less, which includes the drift 306C of approximately 450 mV due to passage of time and the additional shift 306D due to the additional programming cycles. Similarly, the distribution 304C illustrates the threshold voltage distribution for memory cells after additional programming cycles (e.g., one or more megacycles) for memory cells programmed to a logic 0 that are to be programmed to a logic 1. The distribution 304D illustrates the threshold voltage distribution for after two days and additional programming cycles and at a read out at a different (e.g., lower) temperature. For example, the distribution 304D illustrates a cross-temperature scenario 310, in which the memory cell was programmed at one temperature (e.g., 85° C.) and read at a significantly lower temperature (e.g., −40°). As can be seen from the illustration, the memory cells in these scenarios exhibit significant drift. In the illustrated example, the drift 306B is approximately 300 mV, and the drift 308 is approximately 500 mV.

Significant drift in the threshold voltage distributions can cause problems in the operation of the memory device. For example, if the threshold voltage distributions for memory cells that are programmed to a logic 1 shift higher than Vdm, then some memory cells programmed to a logic 1 may be read as a logic 0. Additionally, as mentioned above, for memory cells programmed to a logic 0, drift of these distributions may result in the threshold voltage distribution exceeding Vselect. If the threshold voltage distribution exceeds the selection voltage, then the cell may be unable to be selected and programmed to a different logic value. The distribution 304D illustrates one such example in which at least a portion of the threshold voltage distribution is larger in magnitude than Vselect. In this case, the elapsed time, number of cycles, and cross-temperature accesses cause significant drift, resulting in memory cells that are not selectable with Vselect.

Figure 4A:
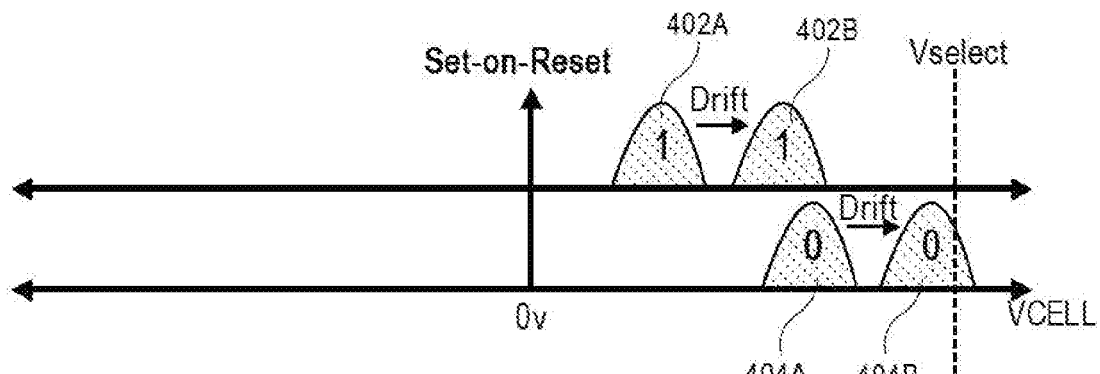
FIGS. 4A-4C illustrates an example of threshold voltage distributions during a reset refresh sequence.
Figure 4B:
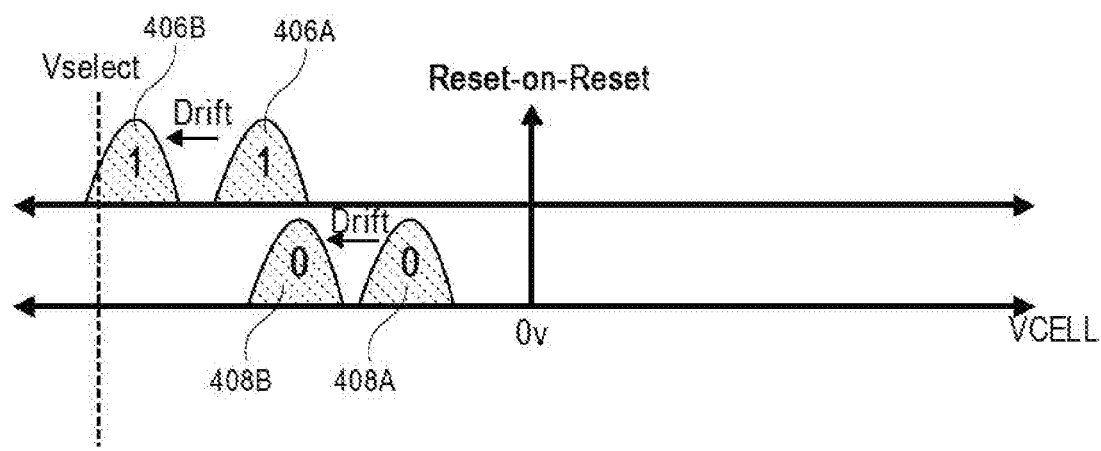
Figure 4C:
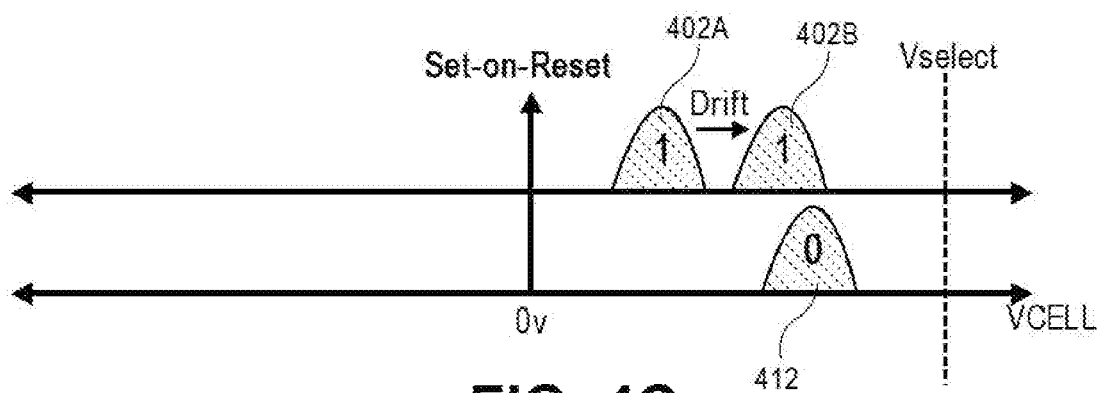

In one example, a reset refresh can used to reduce or cancel drift and enable selection of memory cells that were rendered unselectable due to drift in the threshold voltage distributions. FIGS. 4A-4C illustrates an example of a reset refresh sequence.

FIG. 4A illustrates threshold voltage distributions exhibited by memory cells. The distributions 402A and 402B are for memory cells that were programmed with a logic 1 and the distributions 404A and 404B are for memory cells that were programmed with a logic 0. The threshold voltage distributions shown in FIG. 4A are in response to a set operation to program the memory cells with a logic 1. As explained above with respect to FIG. 3, the memory cells exhibit a lower threshold voltage when being re-programmed with a voltage having the same polarity used for the prior programming operation. Therefore, the memory cells previously programmed to a logic 1 with a positive voltage exhibit lower threshold distributions (distributions 402A and 402B) than the memory cells previously programmed to a logic 0 (distributions 404A and 404B) in the example illustrated in FIG. 4A. The memory cells can experience drift, as discussed above, in response to the passage of time, programming cycles, and/or other conditions. This is shown in FIG. 4A by the drift of distribution 402A to the higher voltages of distribution 402B and the drift of distribution 404A to the higher voltages of distribution 404B. In the illustrated example, in order to select and program a memory cell, the applied voltage Vselect should be higher than the threshold voltage. However, after drift has occurred, some memory cells (especially memory cells programmed to a logic 0 in this example) may exhibit threshold voltages that are higher than Vselect. Such memory cells that exhibit threshold voltages higher than Vselect are not selected and programmed in response to the application of Vselect.

To perform the set operation on cells in the reset state that exhibit excessively high threshold voltages, a reset operation can first be performed, as illustrated in FIG. 4B. FIG. 4B illustrates threshold voltage distributions 406A and 406B exhibited by memory cells programmed with a logic 1 and the distributions 408A and 408B are for memory cells that were programmed with a logic 0. The threshold voltage distributions shown in FIG. 4B are in response to a reset operation to program the memory cells with a logic 0. Therefore, the memory cells previously programmed to a logic 1 with a positive voltage exhibit threshold distributions (distributions 406A and 406B) that are larger in magnitude than the memory cells previously programmed to a logic 0 (distributions 408A and 408B). The memory cells that were previously unselectable with Vselect (e.g., the memory cells with threshold voltages to the right of the dotted line representing Vselect in FIG. 4A), exhibit lower threshold voltages when programmed with a logic 0, and are therefore selectable with Vselect. Accordingly, even though the distribution 408A has drifted to the higher voltages of distribution 408B, the magnitude of the threshold voltages in distribution 408B are all lower than Vselect. Therefore, the reset cells can be refreshed to the same value (e.g., a reset-in-reset operation or a reset-refresh operation). The refresh operation has the effect of canceling or reducing the drift for the refreshed cells. For example, as illustrated in FIG. 4C, the memory cells that had previously experienced drift now exhibit the lower, pre-drift threshold voltage distribution 412. Thus, unlike the memory cells exhibiting high threshold voltages (e.g., as shown by distribution 404B in FIG. 4A), any of the reset cells of FIG. 4C can be selected and programmed from a logic 0 to a logic 1.

Figure 5:
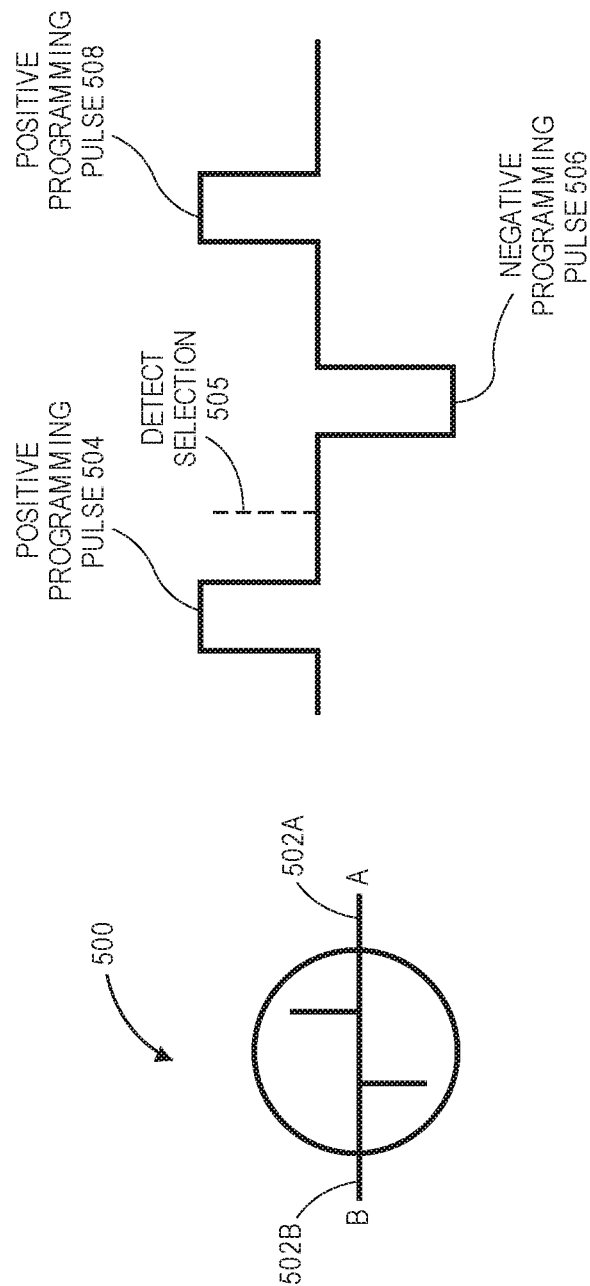
FIG. 5 is a diagram illustrating an example of a sequence of voltage pulses for programming a memory cell including a reset refresh pulse.

FIG. 5 is a diagram illustrating an example of a sequence of voltage pulses for programming a memory cell including a reset refresh pulse. FIG. 5 illustrates a diagram of a memory cell 500 with terminals 502A, 502B (labeled A and B, respectively) for accessing the memory cell 500. In one example, terminals A and B are access lines, such as the access lines 104 and 106 of FIG. 1 or access lines 204 and 206 of FIG. 2. Access circuitry (such as the access circuitry 143 referred to in FIG. 1) can write to or read the memory cell 500 by applying a voltage having a particular magnitude and polarity to the terminals 502A, 502B of the memory cell. For example, FIG. 5 shows a "positive" programming pulse 504, a "negative" programming pulse 506, and a second "positive" programming pulse 508. A positive programming pulse refers to a programming pulse with "positive polarity," which can also be referred to as "forward polarity." A negative programming pulse is a voltage pulse with "negative polarity," which can also be referred to as "reverse polarity." In one example, whether or not a programming pulse is positive or negative is based on the relative voltages applied to the terminals 502A, 502B. A voltage pulse can be defined as positive if the voltage applied to one of the terminals is more positive than the voltage applied to a second of the terminals. For example, referring to FIG. 5, a positive voltage pulse can include: a positive voltage applied to terminal 502A and a negative voltage applied to terminal 502B; a positive voltage applied to terminal 502A and 0 V (e.g., circuit ground or neutral reference) applied to terminal 502B; 0V applied to terminal 502A and a negative voltage applied to terminal 502B, a positive voltage applied to both terminals 502A and 502B, but where the voltage applied to 502A is greater than the voltage applied to 502B; or a negative voltage applied to both terminals 502A and 502B, but where the voltage applied to 502A is greater than the voltage applied to 502B.

In such an example, a voltage pulse applied to the terminals of the memory cell would be negative if the voltage applied to terminal 502A is more negative than the voltage applied to terminal 502B. For example, a negative voltage pulse can include: a negative voltage applied to terminal 502A and a positive voltage applied to terminal 502B; a negative voltage applied to terminal 502A and 0 V (e.g., circuit ground or neutral reference) applied to terminal 502B; 0V applied to terminal 502A and a positive voltage applied to terminal 502B, a negative voltage applied to both terminals 502A and 502B, but where the magnitude of the voltage applied to 502A is greater than the magnitude of the voltage applied to 502B; or a positive voltage applied to both terminals 502A and 502B, but where the magnitude of the voltage applied to 502B is greater than the magnitude of the voltage applied to 502A.

FIG. 5 shows a particular definition of "positive" and "negative" relative to terminals 502A, 502B for illustrative purposes, however, embodiments can define positive and negative differently. For example, an embodiment can define a positive programming pulse to be a voltage pulse in which the voltage applied to terminal 502B is more positive than the voltage applied to terminal 502A.

As mentioned above, access circuitry can both write to and read a memory cell by applying a voltage with a particular magnitude and polarity to the cell. In one embodiment, access circuitry can write different values or logic states to the memory cell by applying voltages with different polarities. For example, the access circuitry can apply a positive programming pulse to write one logic state and a negative programming pulse to write a different logic state. For ease of reference, the following description refers to a positive programming pulse as writing a "logic 1" to memory cell and a negative programming pulse as writing a "logic 0" to a memory cell, although a different convention can be adopted. For example, in one embodiment, access circuitry can apply a negative programming pulse to write a logic 1 and a positive programming pulse to write a logic 0.

Whether or not a voltage applied to a memory cell programs (e.g., causes a state change in) the cell depends upon the magnitude and duration of the applied voltage. In the illustrated embodiment, access circuitry applies programming pulses, such as the programming pulses 504, 506, and 508 with a magnitude that is expected to cause the memory cell to threshold. For example, in one embodiment, the access circuitry can apply a voltage with a magnitude that is greater than or equal to the highest expected threshold voltage exhibited by the memory cell. The duration of a programming voltage pulse can vary depending on implementation, and can be, for example, 1 ns-1 µs.

The voltage pulses can have a variety of shapes. In the example illustrated in FIG. 5A, the programming pulses 504, 506, and 508 are shown as box-shaped pulses (also known as rectangular-shaped or square-shaped pulses). In actual implementations, the voltage pulses may have leading or trailing edges. Other examples can apply voltage pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state.

The sequence of voltage pulses illustrated in FIG. 5 shows a reset refresh technique that can enable programming a memory cell that has experienced significant drift. In the illustrated example, assume the programming pulses are applied to a reset cell (e.g., a memory cell previously programmed to a logic 0). The first programming pulse 504 has a positive polarity to attempt to set the memory cell to a logic 1. The access circuitry then detects (at 505) whether the memory cell was successfully selected in response to the positive programming pulse 504. If the memory cell was not selected (e.g., due to drift), the access circuitry applies a negative programming pulse 506 to the memory cell to reset or refresh the memory cell. As shown in FIG. 4C, the reset-on-reset operation can reduce or cancel the drift experienced by the memory cell. The access circuitry can then apply another positive programming pulse 508 to set the memory cell to a logic 1. In the illustrated example, the second positive programming pulse 508 was effective to program the memory cell to a logic 1 due to the drift-canceling effect of the negative programming pulse 506.

Figure 6A:
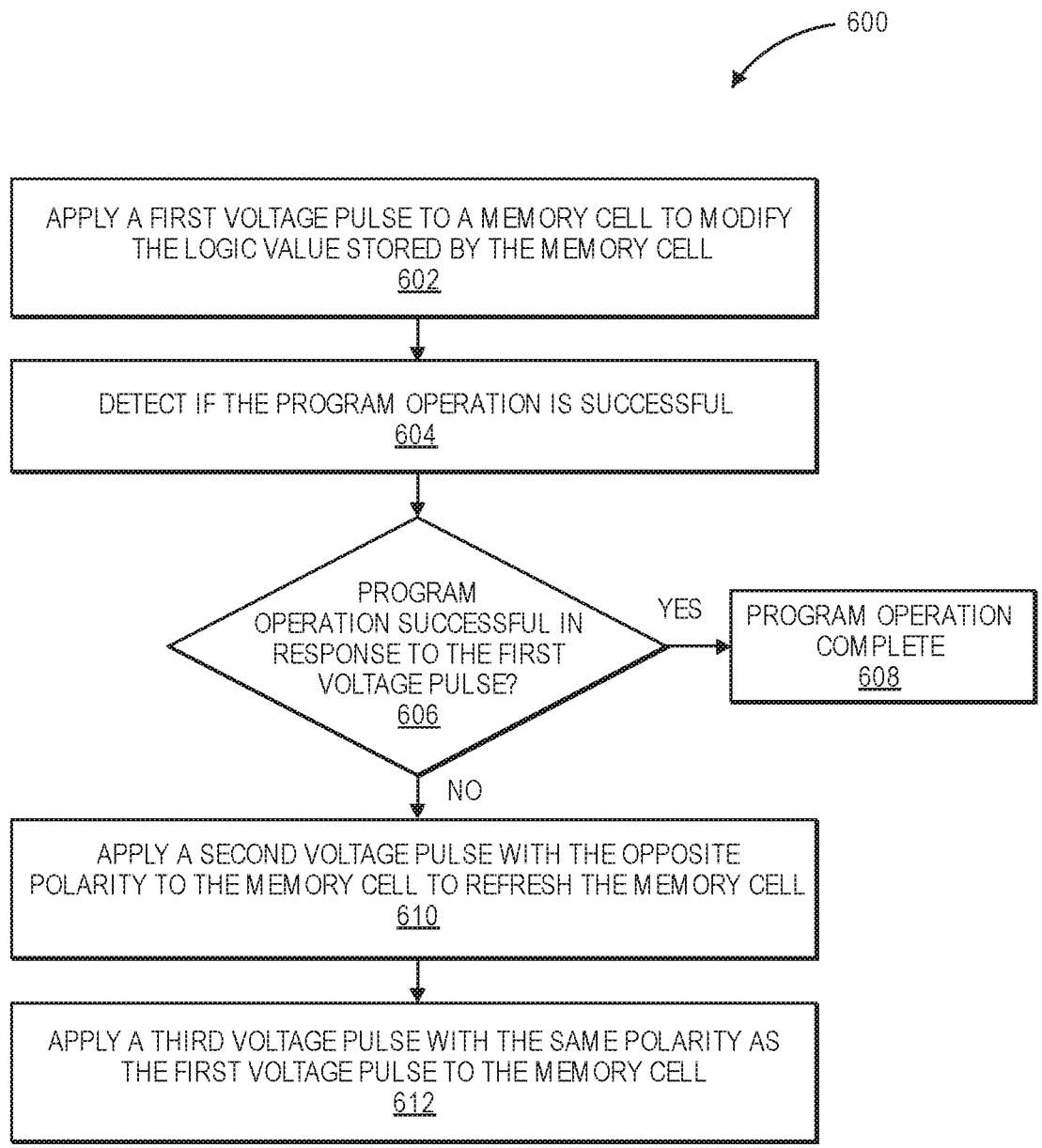
FIGS. 6A and 6B are flow diagrams illustrating examples of methods of programming a memory cell.
Figure 6B:
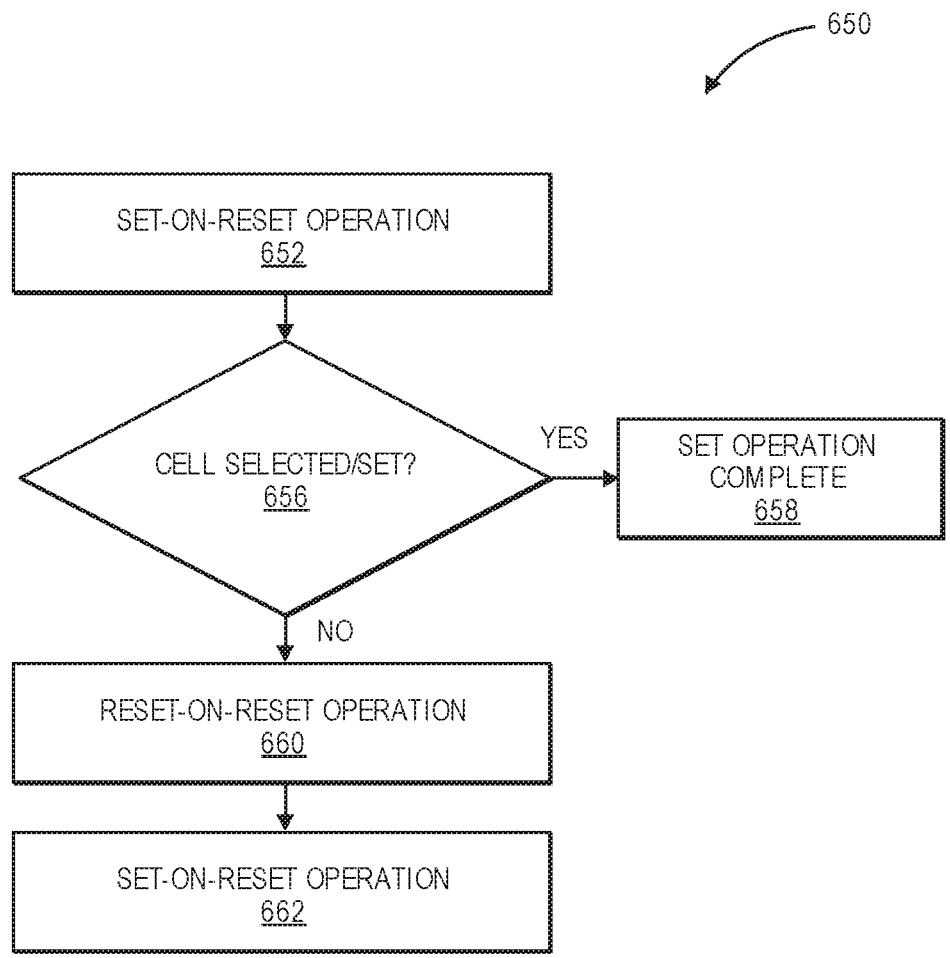

FIGS. 6A and 6B are flow diagrams illustrating examples of methods of programming a memory cell. The operations illustrated in the method 600 and 650 can be performed by hardware logic/circuitry of the memory device. For example, the reset refresh circuitry 745 of FIG. 7 can perform a method such as illustrated in FIGS. 6A and 6B.

Referring to FIG. 6A, the method 600 begins with applying a first voltage pulse to a memory cell to modify the logic values stored by the memory cell, at operation 602. For example, access circuitry of the memory device is to attempt to program a memory cell in response to some memory access request (e.g., from a processor/memory controller). In order to program the memory cell, the access circuitry applies a voltage pulse having the appropriate polarity and magnitude to cause the memory cell to store a new logic value. In one example, the voltage pulse has a magnitude that is greater than the expected threshold voltage distributions of the memory cells, such as illustrated by Vselect in FIGS. 3 and 4A-4C. The polarity of the voltage pulse is based on the logic value to be written, as discussed above.

After applying the first voltage pulse, the access circuitry detects if the program operation is successful, at operation 604. In one example, detecting whether the program operation was successful involves detecting the magnitude of current flowing through or across the memory cell. For example, if significant current flowing, that is an indication that the cell was successfully selected and the program operation succeeded. If there is no current or an insignificant current flowing, that is an indication that the cell was not successfully selected, and therefore the cell was not programmed. Thus, the access circuitry (and/or sense circuitry 743 illustrated in FIG. 7) detects whether the current is equal to or greater than a threshold current. Alternatively, the access circuitry could detect whether the current is equal to or less than a threshold current.

If the access circuitry determines that the program operation was successful, 606 YES branch, the program operation is complete, at operation 608. If the access circuitry determines that the program operation was not successful, 606 NO branch, the access circuitry applies a second voltage pulse with the opposite polarity to the memory cell, at operation 610. The second voltage pulse refreshes the value in the memory cell, and can also serve to reduce drift experienced by the memory cell. The access circuitry can then apply a third voltage pulse with the same polarity as the first voltage pulse (but opposite polarity relative to the second voltage pulse), at operation 612. The third voltage pulse can program the desired value to the memory cell due to the drift-canceling effect of the refresh performed at operation 610.

FIG. 6B is another flow diagram illustrating an example of a method of programming a memory cell. The method 600B is similar to the method 600A, but shows an example with specific voltage polarities. In particular, the method 600B shows a method of setting a reset cell when the cell has experienced drift significant enough to render the cell unselectable.

At operation 652, access circuitry performs a set-on-reset, at operation 652. For example, referring to FIG. 5, access circuitry applies a positive programming pulse (e.g., pulse 504) to attempt to set the memory cell. If the cell is selected or set, 656 YES branch, then the set operation is complete, at operation 658. If the cell is not selected or set, 656 NO branch, then a reset-on-reset is performed, at operation 660. For example, referring to FIG. 5, access circuitry applies a negative programming pulse (e.g., pulse 506) to reset the memory cell. After the reset-on-reset, access circuitry can perform a set-on-reset, at operation 662. For example, the access circuitry applies a second positive programming pulse (e.g., pulse 508) to program the memory cell. In one such example, the reset-on-reset enables setting a memory cell that may have otherwise been unrecoverable due to drift of the threshold voltage.

Figure 7:
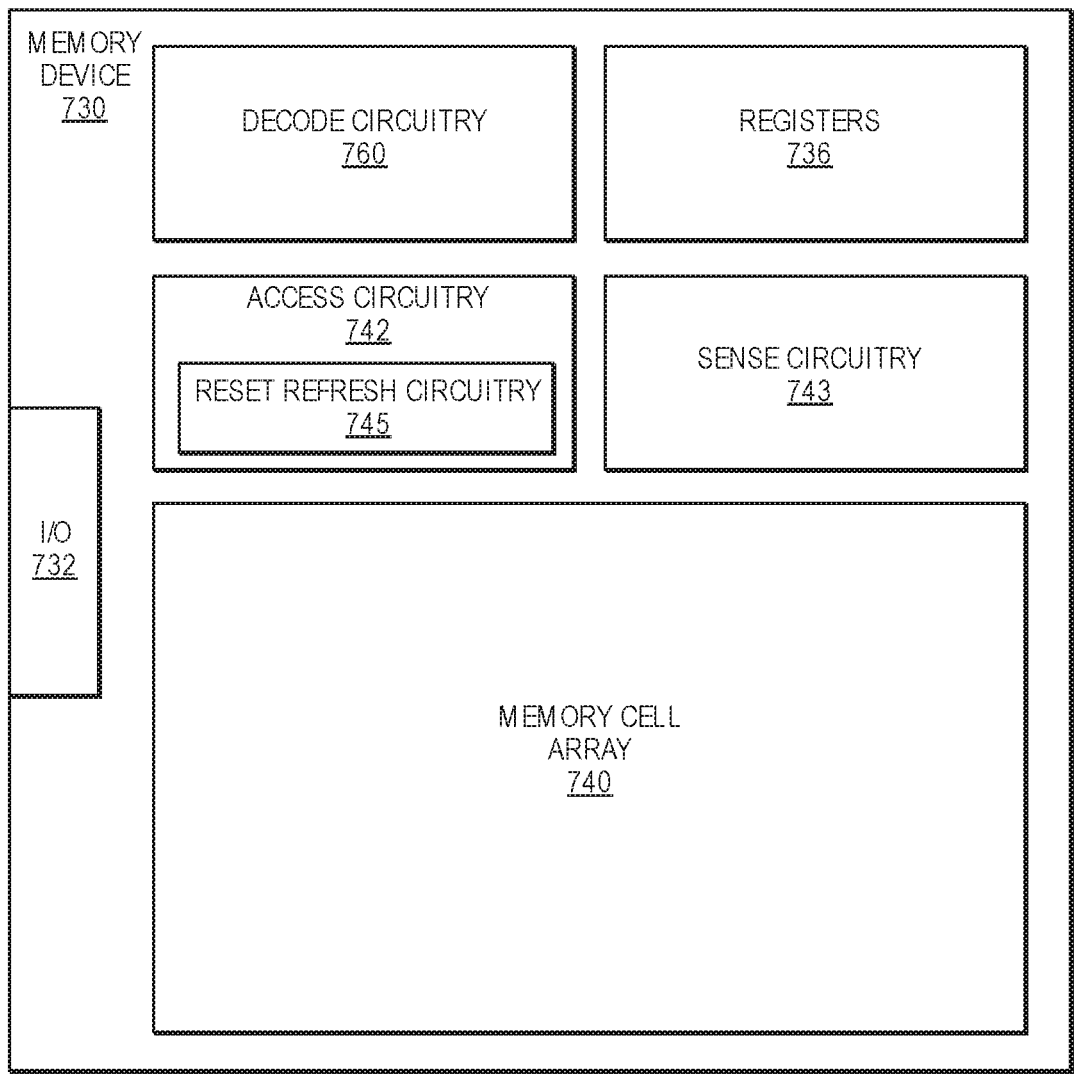
FIG. 7 illustrates a block diagram of an example of a memory device in which reset refresh techniques can be implemented.

FIG. 7 illustrates a block diagram of an example of a memory device in which reset refresh techniques can be implemented. The memory device 730 can provide memory resources to a computing system, such as the system 800 of FIG. 8. The memory device 730 can be one of multiple memory devices in the system. In one example, each memory device is a separate memory die. Each memory device 730 includes I/O interface logic 732 to enable the memory devices to interface with other components, such as a host memory controller and/or processor (not shown in FIG. 7). I/O interface logic 732 can include pins, pads, connectors, signal lines, traces, or wires, or other hardware to connect the memory device to other circuitry, or a combination of these. I/O interface logic 732 can include drivers, receivers, transceivers, or termination, or other circuitry or combinations of circuitry to exchange signals on the signal lines between the devices. The exchange of signals includes at least one of transmit or receive.

The memory device 730 can be disposed directly on a motherboard or host system platform (e.g., a PCB (printed circuit board)) of a computing device. In one example, memory devices can be organized into memory modules (e.g., dual inline memory modules (DIMMs)). In one embodiment, memory modules represent other organization of multiple memory devices to share at least a portion of access or control circuitry, which can be a separate circuit, a separate device, or a separate board from the host system platform.

The memory device 730 includes an array 740 of memory cells. A memory cell is a device or location for storing data. The array 740 of memory cells can accessed via access lines (such as wordlines and bitlines, and/or other access lines). In one example, the array 740 of memory cells includes a 3D crosspoint array such as the memory cell array 200 of FIG. 2. memory device 730 includes decode circuitry 760 to receive and decode command and address information received via I/O 732 (e.g., from a host). Based on the received command and address information, access circuitry 742 performs operations to execute the commands. In the illustrated example, the access circuitry 742 includes reset refresh circuitry 745 to perform a reset refresh to enable the programming of memory cells despite significant drift, as described herein. In the illustrated example, the memory device 730 includes sense circuitry 743 such as sense amplifiers to detect electrical responses of the one or more memory cells in response to applied voltages. Sense circuitry 743 can also be considered as included in access circuitry 742.

In the illustrated example, the memory device 730 also includes one or more registers 736. The registers 736 represent one or more storage devices or storage locations that provide configuration or settings for the operation of the memory device 730. In one example, the registers 736 include one or more Mode Registers. The configuration of locations within registers 736 can configure memory 730 to operate in different "modes," where command information can trigger different operations within memory 730 based on the mode. For example, a reset-refresh sequence can be enabled or disabled based on the values stored in the mode registers 736.

Figure 8:
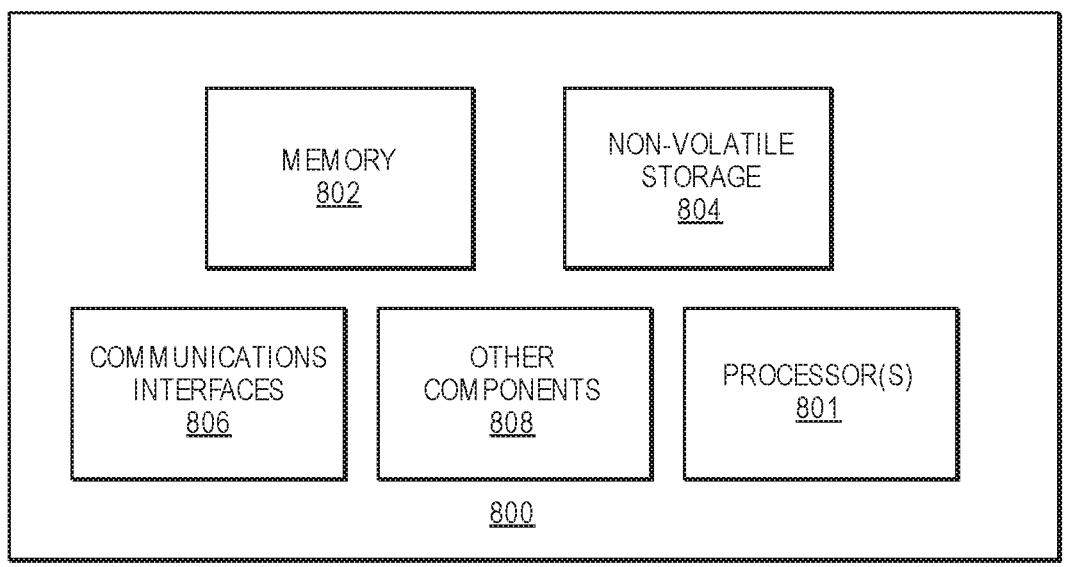
FIG. 8 provides an exemplary depiction of a computing system in which a reset-refresh technique can be implemented Descriptions of certain details and implementations follow, including a description of the figures, which may depict some or all of the embodiments described below, as well as discussing other potential embodiments or implementations of the inventive concepts presented herein.

FIG. 8 provides an exemplary depiction of a computing system 800 (e.g., a smartphone, a tablet computer, a laptop computer, a desktop computer, a server computer, etc.) in which a reset-refresh technique can be implemented. As observed in FIG. 8, the system 800 may include one or more processors or processing units 801 (e.g., host processor(s)). The processor(s) 801 may include one or more central processing units (CPUs), each of which may include, e.g., a plurality of general purpose processing cores. The processor(s) 801 may also or alternatively include one or more graphics processing units (GPUs) or other processing units. The processor(s) 801 may include memory management logic (e.g., a memory controller) and I/O control logic. The processor(s) 801 can include cache on a same package or near the processor.

The system 800 also includes memory 802 (e.g., system memory). The system memory can be in the same package (e.g., same SoC) or separate from the processor(s) 801. In one example, the memory 802 includes a memory device in accordance with examples described herein. In one such example, the memory device is capable of performing a reset-refresh technique as described above. The system 800 can include static random access memory (SRAM), dynamic random access memory (DRAM), or both. In one example, the memory 802 includes a byte addressable Dynamic Random Access Memory (DRAM) or a byte addressable non-volatile memory such as a byte-addressable write-in-place three dimensional crosspoint memory device, or other byte addressable write-in-place non-volatile memory devices (also referred to as persistent memory), such as single or multi-level Phase Change Memory (PCM) or phase change memory with a switch (PCMS), NVM devices, resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, ovonic memory, or a combination of any of the above, or other memory.

The system 800 also includes communications interfaces 806 and other components 808. The other components may include, for example, a display (e.g., touchscreen, flat-panel), a power supply (e.g., a battery or/or other power supply), sensors, power management logic, or other components. The communications interfaces 806 may include logic and/or features to support a communication interface. For these examples, communications interface 806 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system 800 also includes non-volatile storage 804, which may be the mass storage component of the system. Non-volatile types of memory may include byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), 3-dimensional (3D) cross-point memory structure that includes a chalcogenide storage material, hereinafter referred to as "3D cross-point memory", or a combination of any of the above. In one example, the non-volatile storage 804 may also (or alternatively) include circuitry to implement a reset-refresh technique as described herein.

Examples of techniques to enable canceling or reducing drift follow. In one example, a memory device includes an array of memory cells, the memory cells including a chalcogenide storage material. The device includes hardware logic to program one or more of the memory cells, including logic to: detect whether a memory cell is selectable with a first voltage, and in response to detection that a memory cell is not selectable with the first voltage, refresh the memory cell with a second voltage that has a polarity opposite to the first voltage, and after the refresh with the second voltage, program the memory cell with the first voltage. In one example, the logic to detect whether the memory cell is selectable with the first voltage is to detect whether the memory cell conducts current greater than a threshold current in response to the first voltage. In one example, the logic to refresh the memory cell is to apply the second voltage to select and program the memory cell to the same value stored in the memory cell, the second voltage having the polarity opposite to the first voltage. In one example, the second voltage and the first voltage to select the memory cell have the same magnitude.

In one example, the hardware logic is to detect whether the memory cell is selectable if the memory cell was previously programmed to a reset state and is to be programmed to a set state. In one example, the set state corresponds to a logic 1 and the reset state corresponds to a logic 0. In one example, in response to detection that the memory cell is selectable with the first voltage, the memory cell is programmed with the first voltage without refresh. In one example, the chalcogenide storage material is a self-selecting material to enable selection without a separate selector element.

In another example, a memory device includes an array of memory cells, the memory cells including a self-selecting chalcogenide material. The device also includes hardware logic to program one or more of the memory cells, including logic to: apply a first voltage pulse to program a memory cell to a first logic value, and in response to a determination that the memory cell was not programmed to the first logic value with the first voltage pulse: apply a second voltage pulse having a polarity opposite to the first voltage pulse, the second voltage pulse to program the memory cell to a second logic value, and after application of the second voltage pulse, apply a third voltage pulse having the same polarity as the first voltage pulse to program the memory cell to the first logic value. In one such example, the hardware logic to determine whether the memory cell was programmed to the first logic value is to: detect whether the memory cell conducts current greater than a threshold current in response to the first voltage pulse.

In one example, a system includes a processor and a memory device coupled with the processor, the memory device including one or more features described herein. In one example, the system further includes any of a display communicatively coupled to the memory device, a network interface communicatively coupled to the memory, or a battery coupled to provide power to the system.

In one example, a method of programming a memory cell involves: applying a first voltage pulse to the memory cell to modify a logic value stored by the memory cell from a first logic value to a second logic value, and if the memory cell does not store the second logic value in response to the first voltage pulse: applying a second voltage pulse having a polarity opposite to the first voltage pulse to the memory cell to refresh the memory cell with the first logic value, and applying a third voltage pulse having the same polarity as the first voltage pulse to modify the logic value stored by the memory cell from the first logic value to the second logic value. In one such example, the method involves determining whether the memory cell stores the second logic value in response to the first voltage pulse. In one example, determining whether the memory cell stores the second logic value in response to the first voltage pulse comprises detecting whether the memory cell conducts current greater than a threshold current in response to the first voltage pulse.

Thus, reset-refresh techniques can be used to lower the threshold voltage of memory cells that have experienced drift to enable set-on-reset operations with a reduced selection voltage.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Operations can be combined or broken down into sub-operations. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, specialpurpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
an array of memory cells, the memory cells including a chalcogenide storage material; and
hardware logic to program one or more of the memory cells, including logic to:
detect whether a memory cell is selected in response to application of a first program voltage across the memory cell, and
in response to detection that the memory cell was not selected in response to application of the first program voltage:
refresh the memory cell with a second program voltage that has a polarity opposite to the first program voltage, and
after the refresh with the second program voltage, program the memory cell with the first program voltage.

2. The memory device of claim 1, wherein:
the logic to detect whether the memory cell is selected in response to application of the first program voltage across the memory cell is to:
detect whether the memory cell conducts current greater than a threshold current in response to the first program voltage.

3. The memory device of claim 1, wherein:
the logic to refresh the memory cell is to:
apply the second program voltage to select and program the memory cell to the same value stored in the memory cell, the second program voltage having the polarity opposite to the first program voltage.

4. The memory device of claim 3, wherein:
the second program voltage and the first program voltage have the same magnitude.

5. The memory device of claim 1, wherein:
the hardware logic is to detect whether the memory cell is selected if the memory cell was previously programmed to a reset state and is to be programmed to a set state.

6. The memory device of claim 5, wherein:
the set state corresponds to a logic 1 and the reset state corresponds to a logic 0.

7. The memory device of claim 1, wherein:
in response to detection that the memory cell was selected in response to application of the first program voltage, the memory cell is programmed with the first program voltage without refresh.

8. The memory device of claim 1, wherein:
the chalcogenide storage material is a self-selecting material to enable selection without a separate selector element.

9. A memory device comprising:
an array of memory cells, the memory cells including a self-selecting chalcogenide material; and
hardware logic to program one or more of the memory cells, including logic to:
apply a first program voltage pulse to program a memory cell to a first logic value, and
in response to a determination that the memory cell was not selected in response to application of the first program voltage pulse:
apply a second program voltage pulse having a polarity opposite to the first program voltage pulse, the second program voltage pulse to program the memory cell to a second logic value, and
after application of the second program voltage pulse, apply a third program voltage pulse having the same polarity as the first program voltage pulse to program the memory cell to the first logic value.

10. The memory device of claim 9, wherein:
the hardware logic to determine that the memory cell was not selected in response to application of the first program voltage pulse is to:
detect that current through the memory cell in response to the first program voltage pulse has a magnitude that is less than a threshold.

11. The memory device of claim 9, wherein:
the hardware logic is to determine that the memory cell was not selected in response to application of the first program voltage pulse if the memory cell was previously programmed to a reset state and is to be programmed to a set state.

12. The memory device of claim 11, wherein:
the set state corresponds to a logic 1 and the reset state corresponds to a logic 0.

13. A system comprising:
a processor; and
a memory device coupled with the processor, the memory device comprising:
an array of memory cells, the memory cells including a chalcogenide storage material; and
hardware logic to program one or more of the memory cells, including logic to:
detect whether a memory cell is selected in response to application of a first program voltage, and
in response to detection that the memory cell was not selected in response to application of the first program voltage:
refresh the memory cell with a second program voltage that has a polarity opposite to the first program voltage, and
after the refresh with the second program voltage, program the memory cell with the first program voltage.

14. The system of claim 13, wherein:
the logic to detect whether the memory cell is selected in response to application of the first program voltage is to:
detect whether the memory cell conducts current greater than a threshold current in response to the first program voltage.

15. The system of claim 13, wherein:
the logic to refresh the memory cell is to:
apply the second program voltage to select and program the memory cell to the same value stored in the memory cell, the second program voltage having the polarity opposite to the first program voltage.

16. The system of claim 15, wherein:
the second program voltage and the first program voltage have the same magnitude.

17. The system of claim 13, wherein:
the hardware logic is to detect whether the memory cell is selected if the memory cell was previously programmed to a reset state and is to be programmed to a set state.

18. The system of claim 17, wherein:
the set state corresponds to a logic 1 and the reset state corresponds to a logic 0.

19. The system of claim 13, wherein:
in response to detection that the memory cell was selected in response to application of the first program voltage, the memory cell is programmed with the first program voltage without refresh.

20. The system of claim 13, further comprising any of a display communicatively coupled to the memory device, a network interface communicatively coupled to the memory, or a battery coupled to provide power to the system.

* * * * *